(12) United States Patent
Takahashi et al.

(10) Patent No.: US 6,184,702 B1
(45) Date of Patent: Feb. 6, 2001

(54) CROSSTALK PREVENTION CIRCUIT

(75) Inventors: Hiroshi Takahashi, Saitama; Kayoko Ozawa; Kenichi Tashiro, both of Tokyo, all of (JP)

(73) Assignee: Texas Instruments Incorporated, Dallas, TX (US)

( * ) Notice: Under 35 U.S.C. 154(b), the term of this patent shall be extended for 0 days.

(21) Appl. No.: 09/360,229

(22) Filed: Jul. 23, 1999

(30) Foreign Application Priority Data

Jul. 23, 1998 (JP) .................................................. 10-208335

(51) Int. Cl.[7] .............................. H03K 17/16; H01L 23/48
(52) U.S. Cl. .............................. 326/21; 326/93; 326/101; 327/382; 327/403; 257/659
(58) Field of Search ................................ 326/21, 101, 93, 326/96, 14, 16; 327/379, 382, 403, 293, 295, 297; 257/659

(56) References Cited

U.S. PATENT DOCUMENTS

| | | | |
|---|---|---|---|
| 5,136,358 * | 8/1992 | Sakai et al. ........................... | 257/659 |
| 5,306,967 * | 4/1994 | Dow ...................................... | 326/101 |
| 5,646,556 * | 7/1997 | Longwell et al. ...................... | 326/93 |
| 5,994,946 * | 11/1999 | Zhang .................................. | 327/403 |
| 6,081,022 * | 1/2000 | Mitra et al. ........................... | 257/659 |

\* cited by examiner

*Primary Examiner*—Jon Santamauro
(74) *Attorney, Agent, or Firm*—Frederick J. Telecky, Jr.; William B. Kempler

(57) ABSTRACT

Offers a circuit that reduces or removes crosstalk with a method that does not exert influence on improvements in miniaturization and the degree of integration. The crosstalk prevention circuit, between at least two signal lines that are formed almost in parallel, for example, a master clock line and a slave clock line 11, 12, makes a third signal line 13 that applies a signal when a signal is not applied to at least one of these two signal lines, for example, a test signal, and becomes in a grounded condition when a signal is applied to the above-mentioned two signal lines. Preferably, a driver circuit is connected to the third signal line, and the ratio of the current drive capabilities of the N channel transistor and the P channel transistor of the output transistors of said driver circuit is made about 2:1.

6 Claims, 16 Drawing Sheets

Delay time seen from the rise of the clock 1mt

Output in the case wherein crosstalk is considered and the case wherein it is not considered between (the clocks) 1mt and 1st Circuit used for the purpose of checking the limits of the P/N ratio for the 1tt clock buffer Output in the event only the clock is inputted to 1st, and the buffer size of 1tt is made Pch = 80 μm/Nch = 2 μm Influence of crosstalk on the bus line Circuit using SSt as a shield Effects in the case of using 1st as a shield Effects on the smt2 line in the event the sst bus line is used as a shield Effects on the smt1 line in the event the sst bus line is used as a shield Influence on sst line used as a shield

CROSSTALK PREVENTION CIRCUIT

FIELD OF THE INVENTION

The present invention relates to a circuit that reduces the influence of crosstalk in electronic circuits, and specifically, it relates to a crosstalk prevention circuit that reduces or removes the influence of crosstalk in digital signal processors (DSPs), ICs, or other types of semiconductor devices, etc.

BACKGROUND Of THE INVENTION

The explanation pertains to electronic circuits that are made up of semiconductor devices, for example, digital signal processors (DSPs), microprocessors, memory circuits, etc.

Various attempts have been made to miniaturize semiconductor devices and to increase their operating speed. However, an obstacle to changing to high-speed operation in these types of circuits is the signal propagation delays of the signal lines.

The signal propagation delay of signal lines is mainly due to the wiring resistance of the semiconductor device, for example, a metal film semiconductor device (MOS device), and the wiring capacitance (electrostatic wiring capacitance).

The main factor controlling the electrostatic wiring capacitance in manufacturing processes of up to about 0.8 $\mu$m is the electrostatic capacitances between the wires and the semiconductor substrate. However, accompanying progress in miniaturization, the distance between adjacent wires in the semiconductor device has been greatly reduced, the electrostatic capacitance between adjacent wires is impossible to ignore, and in manufacturing processes of 0.6 $\mu$m and below, when the wiring is formed with minimum spacing, the electrostatic capacitance between adjacent wires accounts for more than 90% of the total electrostatic capacitance.

Crosstalk has increased due to the increase in electrostatic capacitance between wires. The increase in crosstalk increases the signal delay. Such signal delays that result from crosstalk are the cause of various problems.

For example, when crosstalk occurs in the clock wiring, there are instances when deterioration of performance occurs that results from the delay of the clock, and there is the possibility that with a two phase clock, skewing (phase offset) between the two phase clocks occurs.

Also, if crosstalk occurs in a bus line, the delay due to the crosstalk will limit the operating speed of the IC. That is, the crosstalk will determine the operating speed of the IC.

In other electronic circuits problems also occur, such as skewing, lowering the operating speed, and operating errors due to distortion of the pulse signal, which originate with crosstalk in the same manner.

In general, there have been various attempts to prevent this type of crosstalk. For example, in one method the distance between adjacent wires is increased, but this method cannot be applied to semiconductor devices and semiconductor circuits in which miniaturization has advanced since the surface area increases.

As another general method, there is the method that adopts barriers (shields). However, if shields are implemented, the surface area becomes a problem. The fact that new area is required for implementation of shields makes this method inapplicable to the semiconductor devices and Ics whose fineness and integration level are required to be further improved.

Therefore, the present invention offers a circuit wherein the crosstalk can be reduced or eliminated with a method that does not affect improvements in miniaturization or the integration level.

SUMMARY OF INVENTION

According to the first point of view of the present invention, a crosstalk prevention circuit is offered wherein between at least two approximately parallel signal lines, a third signal line is installed, to which a signal is applied when a signal that is to be applied to at least one of aforementioned two signal lines is not present and which becomes grounded when a signal is applied to the above-mentioned two signal lines.

Preferably, a driver circuit is connected to the above-mentioned third single line, and the ratio of the current drive capabilities of the N-channel transistor and the P-channel transistor of the output transistors of said driver circuit is about 2:1.

Also, preferably, a first clock and a second clock that has a prescribed phase difference relative to said first clock are applied to the above-mentioned first and second signal lines, and a signal that is applied during test operations is applied to the above-mentioned third signal line.

Also, preferably, the above-mentioned first and second signal lines are signal lines in which the voltage is changed by means of a first signal, and the above-mentioned third signal line is a signal line in which the voltage is changed by means of a signal having a phase that is different than the above-mentioned first signal.

Also, according to the second point of view of the present invention, a crosstalk prevention circuit is offered having wiring that is characterized in that the first power supply metal wiring and the second power supply metal wiring are provided in parallel separated by a prescribed distance at both sides of the metal signal wiring on which a pulse signal is propagated, and the width of the above-mentioned metal signal wiring and the above-mentioned first and second power supply metal wiring are made widths in which the resistance to electromigration is improved.

Preferably, even if the above-mentioned metal signal wiring, the above-mentioned first power supply metal wiring, and the above-mentioned second metal wiring are in different layers, the above-mentioned metal signal wiring is surrounded by the above-mentioned first power supply metal wiring and the above-mentioned second power supply metal wiring.

Figure 1:
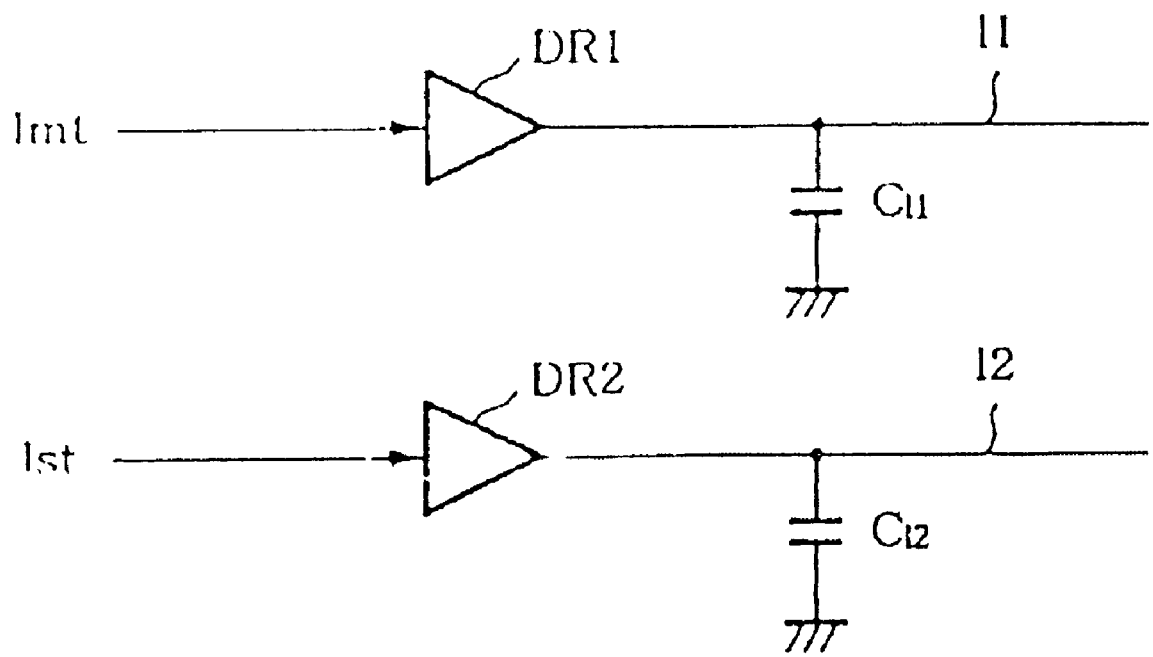
FIG. 1 is a diagram wherein, in an ideal condition in which the influence of crosstalk is not considered, the wiring 11 used for the master clock 1*mt* and the wiring 12 used for the slave clock 1*st* are made adjacent and wired in parallel, and the master clock 1*mt* and the slave clock 1*st* are propagated through the medium of the respective driver circuits DR1, DR2.

REFERENCE NUMERALS AND SYMBOLS AS SEEN IN THE DRAWINGS 11, 12, 13. Wiring
DR1 to DR3. Driver circuit

DESCRIPTION OF EMBODIMENTS

Embodiment 1

As Embodiment 1 of a crosstalk prevention circuit of the present invention, a case is illustrated that is applied to a two phase clock circuit used as an internal clock for a central processing unit (CPU) of a semiconductor device such as a DSP or an IC.

The internal clock of a CPU, is illustrated for the case of a three system clock, wherein, besides the two phase clocks comprising a master clock 1mt and a slave clock 1st that has a prescribed phase difference relative to this master clock 1mt a test clock 1tt is provided for the purpose of conducting a test of the circuit without the master clock 1mt.

The master clock 1mt and the slave clock 1st run when the semiconductor device is operating, and the test clock 1tt does not influence normal operation by being grounded when the semiconductor device operates normally.

The three wirings for the master clock 1mt, the slave clock 1st, and the test clock 1tt are normally made wirings (wires) that are approximately parallel in the CPU main body. Normally, as illustrated in FIG. 1, the wiring 11 used for the master clock 1mt and the wiring 12 used for the slave clock 1st are formed adjacent to one another. Thus, crosstalk between the master clock 1mt and the slave clock 1st may occur.

In order to know to the extent of the influence of this crosstalk, the inventors of this application prepared a simple model by considering only electrostatic capacitance, and conducted simulations by means of the "SPICE" circuit simulation program.

FIG. 1 is a schematic diagram of a clock supply circuit (two phase clock circuit) for the ideal case in which the influence of crosstalk is ignored; the wiring 11 used for the master clock 1mt and the wiring 12 used for the slave clock 1st lie adjacent and parallel to each other; the master clock 1mt and the slave clock 1st are propagated via the respective driver circuits DR1, DR2. $C_{11}$ and $C_{12}$ respectively represent the electrostatic capacitance of the wiring 11,12.

Figure 2:
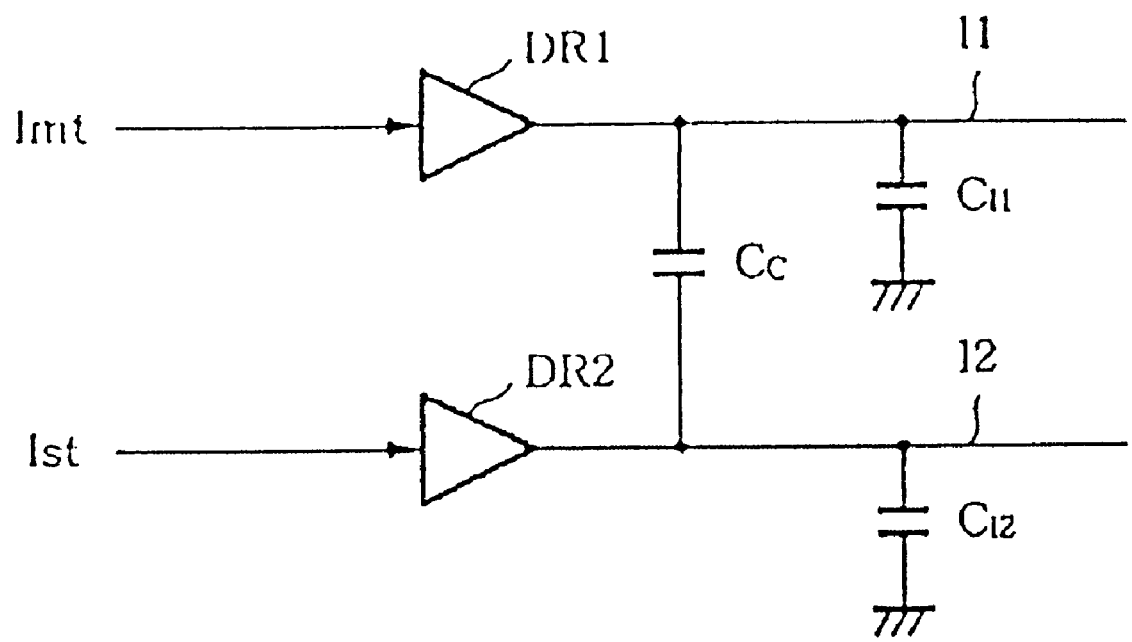
FIG. 2, different than FIG. 1, is a circuit diagram wherein, in a configuration in which the influence of crosstalk is considered, the wiring 11 used for the master clock 1*mt* and the wiring 12 used for the slave clock 1*st* are made adjacent and wired in parallel, and the master clock 1*mt* and the slave clock 1*st* are propagated through the medium of the respective driver circuits DR1, DR2.

FIG. 2 is unlike FIG. 1 in that it is a schematic diagram that takes the influence of crosstalk into consideration; the wiring 11 used for the master clock 1mt and the wiring 12 used for the slave clock 1st lie adjacent and parallel to one another, and the master clock 1mt and the slave clock 1st are propagated via the driver circuits DR1, DR2, respectively. Cc represents the electrostatic capacitance Cc between the wiring 11, 12, 13.

Figure 3:
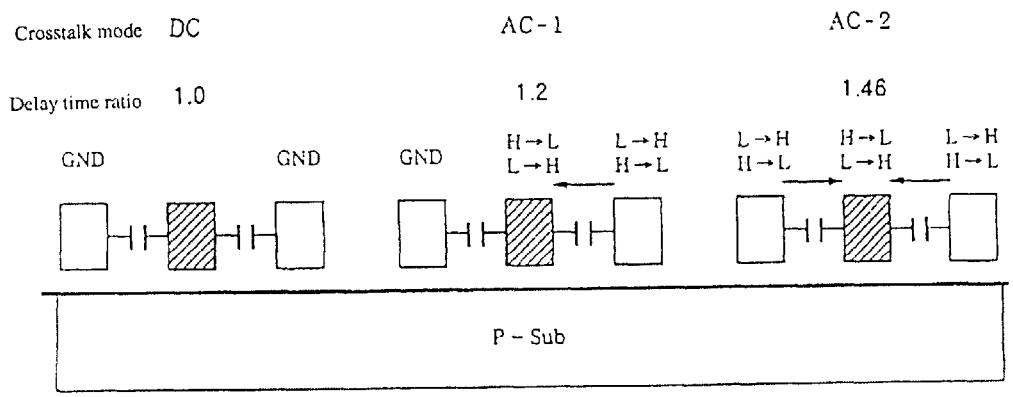
FIG. 3 is a diagram illustrating the various modes of crosstalk.

FIG. 3 is a diagram illustrating various crosstalk modes. Types of crosstalk include DC crosstalk due to DC voltage, AC-1 crosstalk due to AC voltage on one side, and AC-2 crosstalk due to AC voltage on both sides.

As explained above, due to miniaturization of LSI devices in recent years, signal delay that results from crosstalk in the wiring section has become a problem. When designs, etc., were proposed in which the operating timing and the phase of the signals on the adjacent wires were changed to solve this problem, it was seen that the signal propagation delay due to crosstalk increased as much as 46%. This is summarized in FIG. 4. For example, if the signal that changes with the master phase is liberated, when a given signal changes from high to low, and the signal lines on both sides change from low to high, then the delay due to the coupling that accompanies the increase in the interwiring capacitance that results from the reduction of the wiring spacing in the miniaturization of VLSI devices in recent years has become a huge problem.

Figure 4:
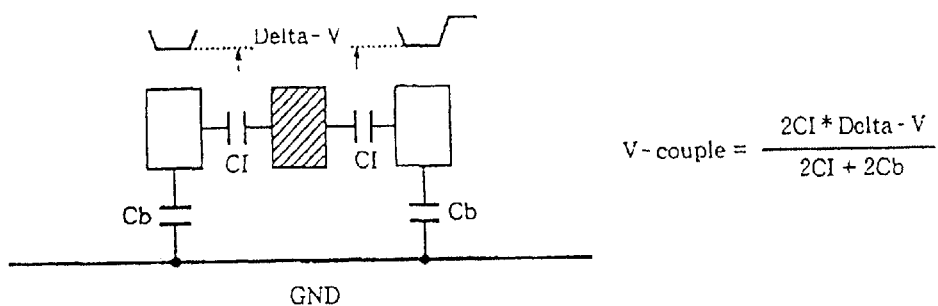
FIG. 4 is a diagram illustrating the generation of crosstalk from an adjacent circuit that is electrically connected through the medium of electrostatic capacitance.

FIG. 4 is a diagram illustrating the generation of crosstalk between adjacent circuits that are electrically coupled via electrostatic capacitance; it shows a model and an equation for finding the value of the coupling voltage during the timing operation that is linked to an increase in the delay time.

FIGS. 5(A) to (C) are graphs that illustrate, how the crosstalk receiver is influenced due to the changes (changes in timing) of the adjacent crosstalk sources 1, 2 and the signal transition conditions of the signal (crosstalk receiver) that receives crosstalk.

Figure 5:
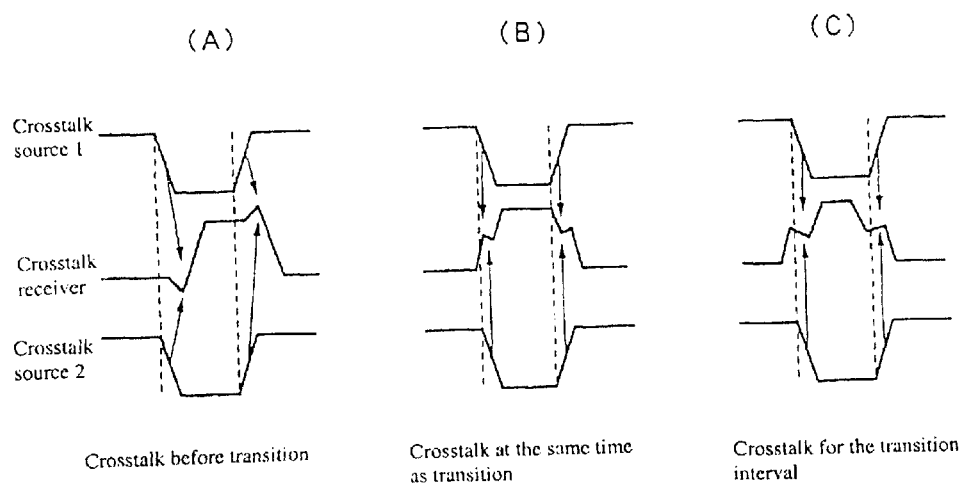
FIGS. 5(A) to (C) are graphs illustrating the results wherein how electromigration undergoes influence due to a signal transition condition of signals which receive crosstalk (crosstalk receiver), and changing (changes in timing) of adjacent crosstalk sources 1, 2, are analyzed.

As is shown in FIGS. 3–5, various types of crosstalk with various features can be received.

However, first, the simulation conditions and results for the comparatively simple circuits illustrated in FIG. 1 and FIG. 2 will be explained below.

The model shown in FIG. 2 that takes crosstalk into consideration will be explained. It is assumed that 90% of the electrostatic wiring capacitance between the master clock 1mt and the slave clock 1st is due to the electrostatic wiring capacitance $C_{r1}$, $C_{r2}$ of the wiring 11, 12, and 45% of one side is taken as the electrostatic interwiring capacitance Cc that becomes the cause of the mutual crosstalk between the adjacent wiring 11–12, and is added between the wiring 11–12.

By combining this model and the model for the ideal case in which the influence of crosstalk is not considered, as in FIG. 1, the period of non-overlap (isolation) of the master clock 1mt and the slave clock 1st were used as an input clock between 0.4 ns to 0.7 ns, and the simulation results explained below were obtained.

Figure 6:
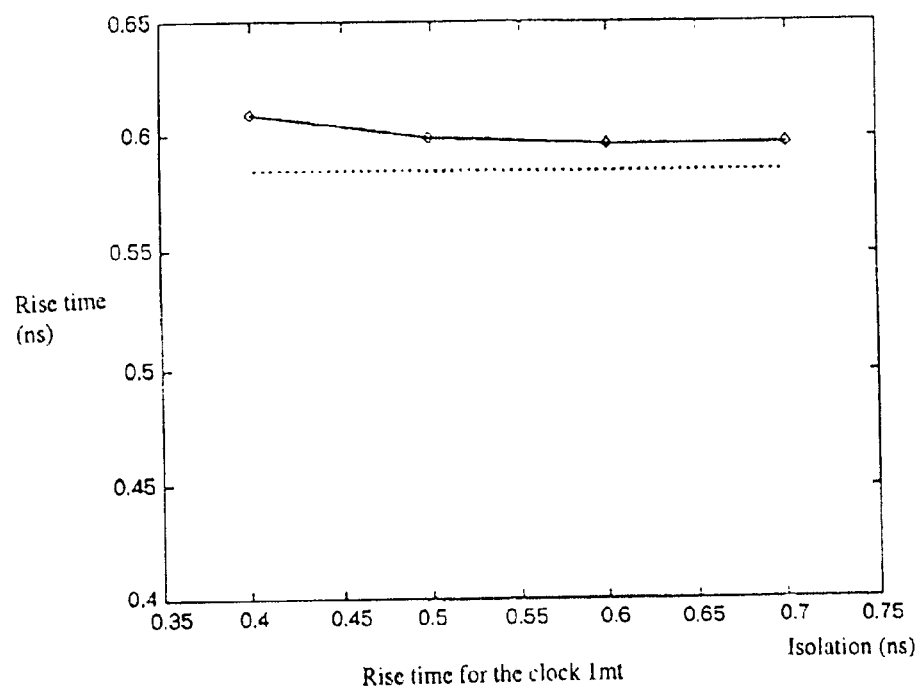
FIG. 6 is a characteristics graph for the rise time of the master clock 1mt in FIG. 2.

FIG. 6 is a graph of the rise time characteristics of the master clock 1mt. The abscissa shows the isolation, and the ordinate shows the rise time. The dotted line is the curve that results for the circuit of FIG. 1, when it is assumed that there is no crosstalk, and the solid line is the curve that results for the circuit of FIG. 2, which takes crosstalk into consideration.

Figure 7:
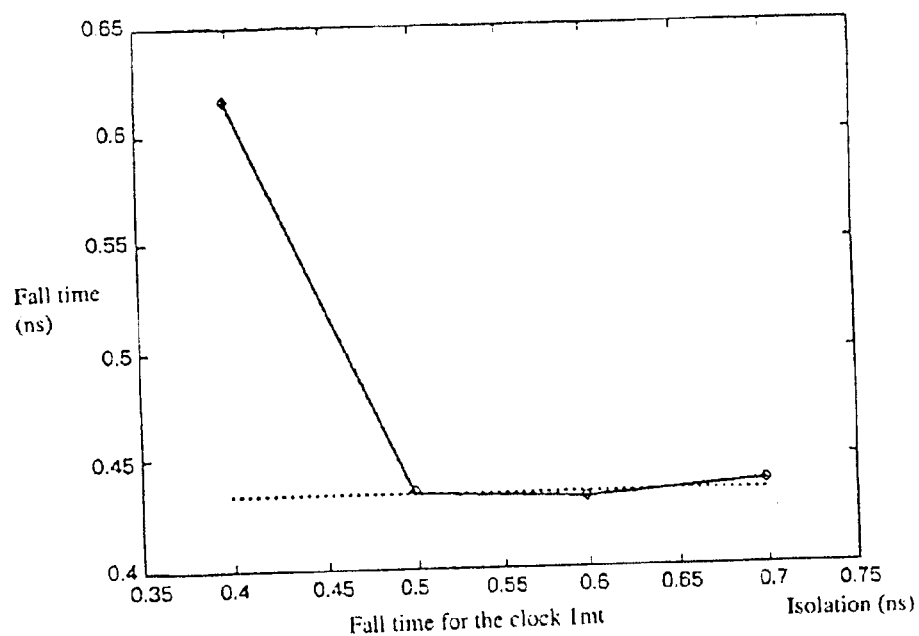
FIG. 7 is a characteristics graph for the fall time of the master clock 1mt in FIG. 2.

FIG. 7 is a graph of the fall time characteristics for the master clock 1mt. The abscissa shows the isolation, and the ordinate shows the fall time. The dotted line is the curve for that results for the circuit of FIG. 1, when it is assumed that there is no crosstalk, and the solid line is the curve that results for the circuit of FIG. 2, which includes the influence of crosstalk.

Figure 8:
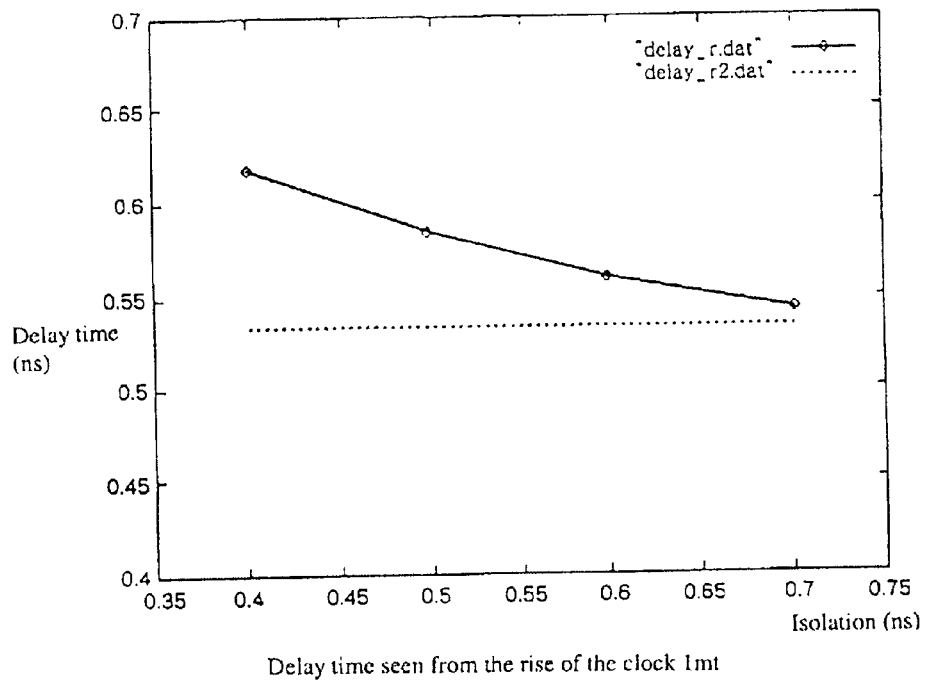
FIG. 8 is a characteristics graph of the gate delay time seen from the rise of the master clock 1mt in FIG. 2.

FIG. 8 is a graph of the gate delay time characteristics, via response to the rise of the master clock 1mt. The abscissa shows the isolation, and the ordinate the delay time. The dotted line is the curve that results for the circuit of FIG. 1, when it is assumed that there is no crosstalk, and the solid line is the curve that results for the circuit of FIG. 2, which includes the influence of crosstalk.

In FIG. 6 to FIG. 8, the rise time is defined as the time that it takes for the waveform to go from 10% to 90% of its final value. The gate delay time is the length of time from 50% of the input level to a 50% of the output level.

These results show that as the isolation decreases, the delay time due to the crosstalk increases. The gate delay time when the isolation was 0.4 ns increased 0.08 ns compared to the case in which there was no crosstalk. The waveform for this time is shown in FIG. 9.

Figure 9:
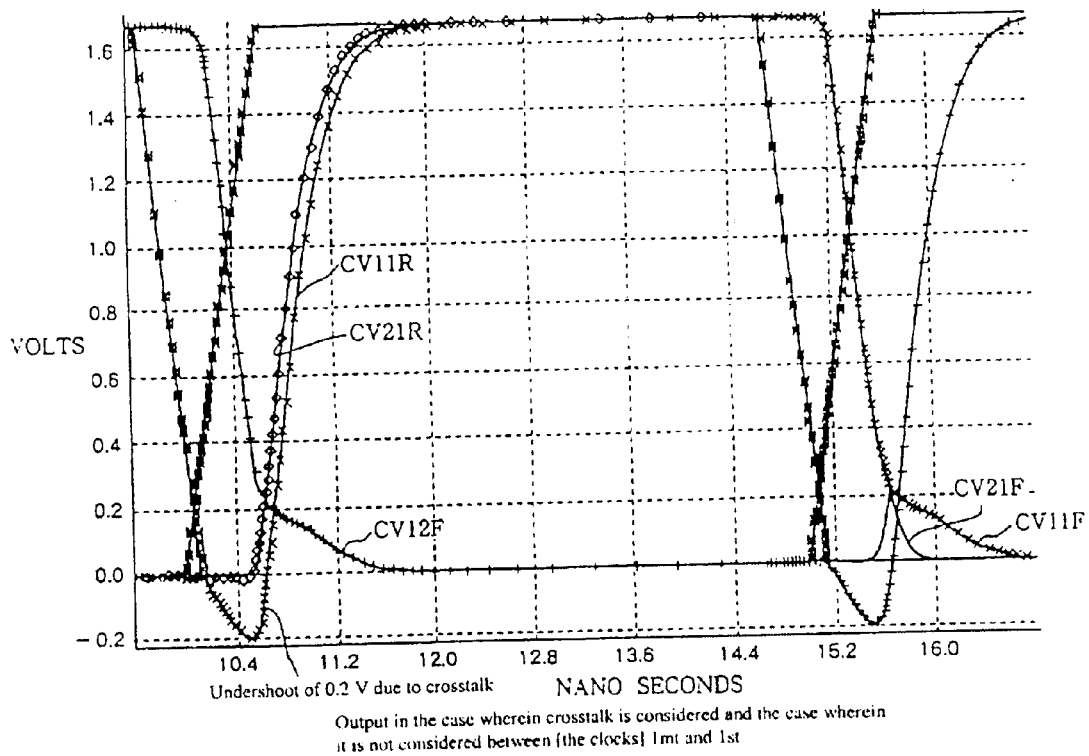
FIG. 9 is a graph illustrating the signal changes when the crosstalk between the wiring for the master clock 1mt and the slave clock 1st is considered, and when the crosstalk is not considered, in FIG. 2.

FIG. 9 is a graph illustrating the signal changes in the case in which the crosstalk between the lines of the master clock 1mt and the slave clock 1st was considered, and the case in which it was not considered.

Curve CV11R is a curve showing the rise time characteristics for the case in which there was crosstalk of CV12F.

Curve CV21R is a curve showing the rise time characteristics for the case in which there was no crosstalk.

The output of the master clock 1mt for the case in which there was crosstalk (curve CV11R), rises after it has dropped to –0.2 V due to the crosstalk. Thus, the waveform is delayed compared to the case in which there was no crosstalk. Next, if the fall time is considered (curve CV12F), in accordance with the above-mentioned results, there is almost no difference down to a 50% level, but going from about 0.2 V down to 0 V takes 0.1 n or more [sic]. This greatly affects the fall time.

Due to this type of crosstalk influence, a skew is generated between the master clock 1mt and the slave clock 1st.

Figure 10:
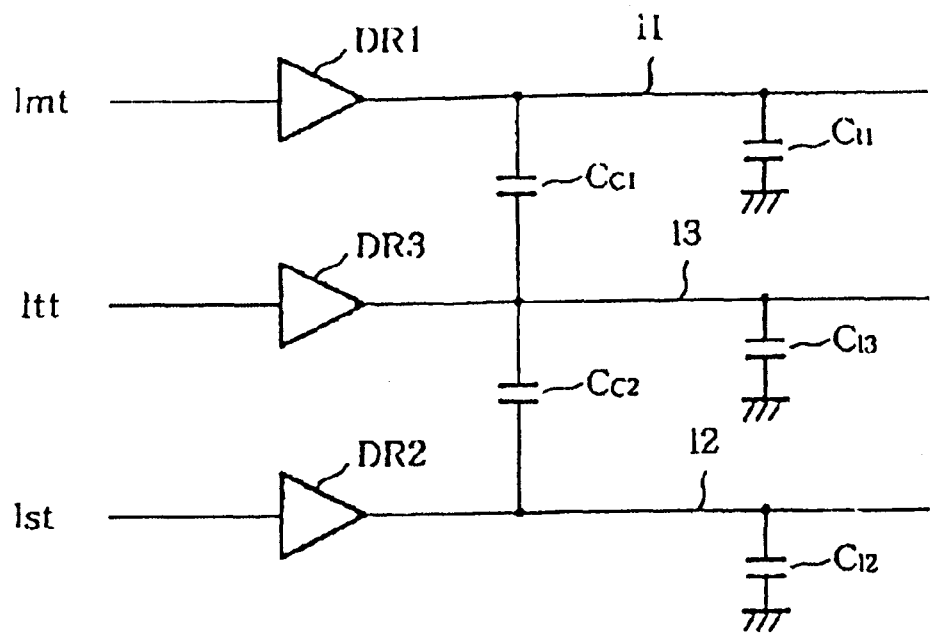
FIG. 10 is a crosstalk prevention circuit diagram for the Embodiment 1 of the present invention.
Figure 10:
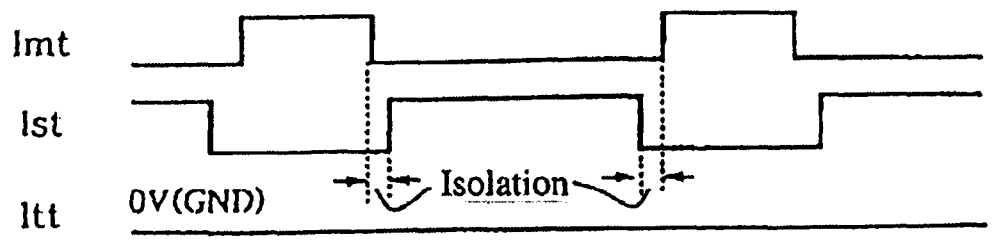
Figure 10:
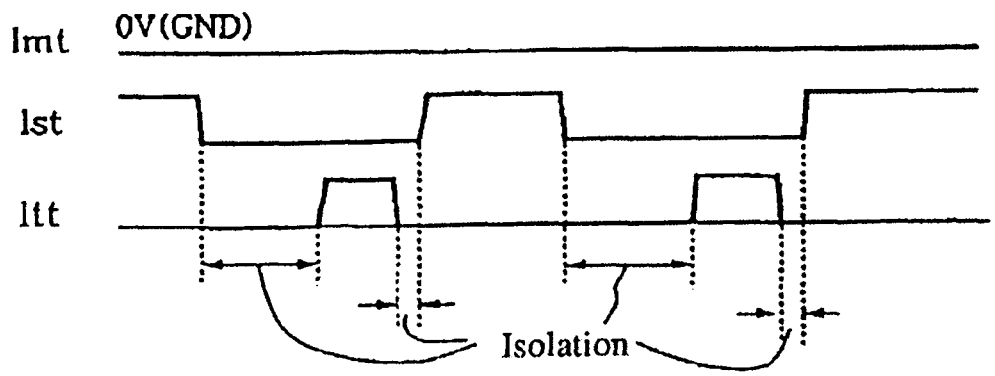

A circuit for the purpose of preventing an increase in the rise and fall time of the clock due to the above-mentioned waveform distortion is illustrated in FIG. 10.

FIG. 10 is a diagram of the crosstalk prevention circuit of Embodiment 1 of the present invention.

As for the crosstalk prevention circuit illustrated in FIG. 10, the master clock 1mt is propagated via the wiring 11 to which the driver circuit DR1 is connected, the slave clock 1st is propagated via the wiring 12 to which the driver circuit DR2 is connected, but between wiring 11 and 12, is a circuit through which the test clock 1tt propagates via wiring 13 to which the driver circuit DR3 is connected. The electrostatic wiring capacitance of wiring 11, 12, 13 is represented by $C_{t1}$, $C_{t2}$, $C_{t3}$, respectively, and the interwiring electrostatic capacitance between wiring 11, 12, 13 is represented by $C_{C1}$, $C_{C2}$ respectively.

As explained above, the internal clock for the CPU is a three system clock that includes, besides the master clock 1mt and the slave clock 1st, which maintains a prescribed phase relation to this master clock 1mt, a scan test clock 1tt that is used to test the circuit without the master clock 1mt.

The three main clock wirings 11, 12, 13 for the master clock 1mt, the slave clock 1st, and the test clock 1tt, respectively, are normally connected approximately parallel in the CPU. Normally, as is illustrated in FIG. 1 and FIG. 2, the wiring 11 used for the master clock 1mt and wiring 12 used for the slave clock 1st run side by side, but in the configuration for this embodiment, the wiring 13 used for the test clock 1tt runs between the wiring 11 and 12, and thus also acts as shield wiring, prevents crosstalk between the master clock 1mt and the slave clock 1st, and prevents signal delay and waveform distortion.

In the circuit of FIG. 10, the wiring 13 used for the test clock 1tt is connected between the wiring 11 used for the master clock 1mt and the wiring 12 used for the slave clock 1st, and since it also acts as shield wiring it has the advantage of not increasing the surface area of the semiconductor device do.

The master clock 1mt and the slave clock 1st are the clocks for the active condition when the semiconductor device is operating, and since the test clock 1tt is grounded during normal operations of the semiconductor device and does not influence normal operation, the shielding effect of the wiring 13 is advantageous.

However, since the wiring 13 used for the test clock 1tt is connected between the wiring 11, 12 used for the master clock 1mt and the slave clock 1st, respectively, crosstalk between the test clock 1tt and the slave clock 1st will occur.

In the configuration of this embodiment, preferably, in order to increase the stability of the signal level of the wiring 12, 13, the current drive capacity of for the P-channel transistor that forms the driver circuit DR3 is decreased, and that of the N-channel transistor is increased.

The change in width of the P/N-channel transistors—the length is not changed—of this type of driver circuit causes the test clock 1tt to slow down, but since the test clock 1tt, unlike the master clock 1mt and the slave clock 1st, is used only during tests, there is no problem if it does slow down. Since the rise of the test clock 1tt is delayed and since there is greater isolation between it and the slave clock 1st than during normal operation skewing due to crosstalk can be prevented.

In regard to the crosstalk prevention circuit of FIG. 10, in the same manner as with the circuit of FIG. 1 and FIG. 2, a simulation was conducted by means of "SPICE" and the results are presented.

Figure 11:
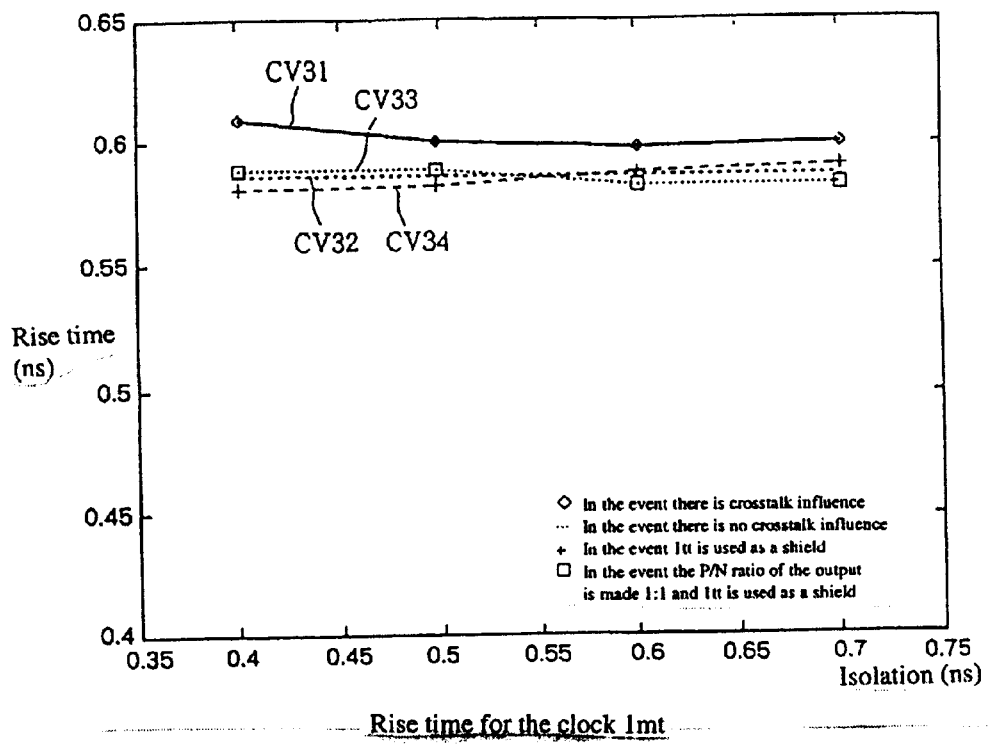
FIG. 11 is a characteristics graph for the rise time of the master clock 1mt in FIG. 10.

FIG. 11 is a graph of the rise time characteristic of the master clock 1mt. The abscissa shows the isolation and the ordinate the rise time. The curve CV31 shows the results when there is crosstalk, the curve CV32 shows the results when there is no crosstalk, the curve CV33 shows the results when the driver circuit DR3 is left as is in the normal condition and the test clock wiring 13 used for the test clock 1tt is distributed to act as a shield, and the curve CV34 shows the results for the case when the wiring 13 used for the test clock 1tt is distributed to act as a shield and the ratio of the widths of the P/N-channel transistors of the driver circuit DR3 is 1:1.

Figure 12:
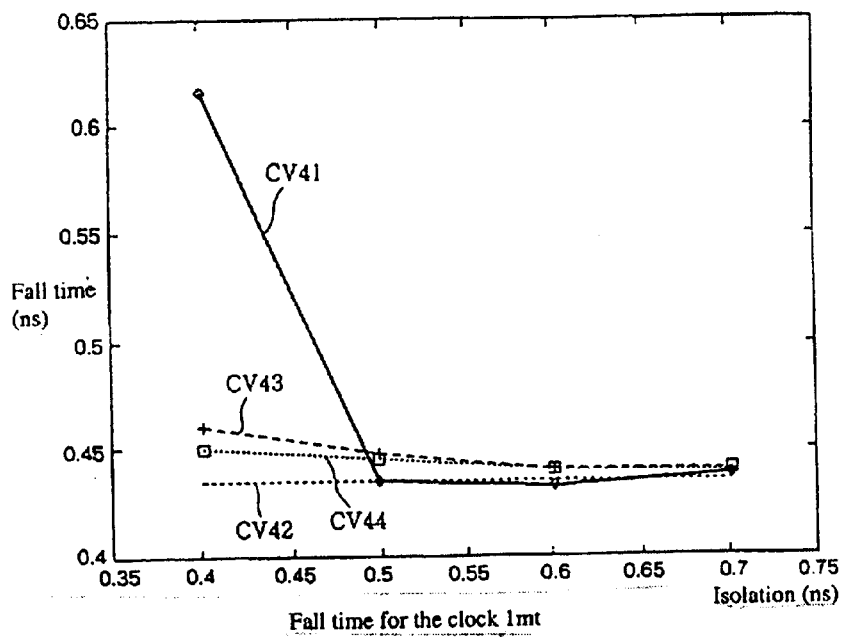
FIG. 12 is a characteristics graph for the fall time of the master clock 1mt in FIG. 10.

FIG. 12 is a graph of the fall time characteristic fall time of the master clock 1mt. The abscissa shows the isolation, and the ordinate the fall time. Curve CV41 shows the results when there is a crosstalk, curve CV42 shows the results when there is no crosstalk influence, curve CV43 shows the characteristics results when the wiring 13 used for the test clock 1tt is distributed to act as a shield, and the driver circuit DR3 is left as is in its normal condition, and curve CV44 shows the characteristics results when the wiring 13 used for the test clock 1tt is distributed to act as a shield and the ratio of the widths of the P/N-channel transistors of the driver circuit DR3 is 1:1.

Embodiment 1 of the first embodiment will be explained below.

Table I indicates the ratio of the widths of the P/N-channel transistors and the size of the output transistors of the driver circuits DR1 to DR3 used in this embodiment. The length of the transistors is 0.6 μm in all cases.

TABLE I

Size of the driver (buffer) for each clock used in the embodiment

| Buffer size | Ratio of the widths of the P/N-channel transistors |
|---|---|
| 1mt 166 μm/98 μm | 1.69 |
| 1st 218 μm/132 μm | 1.65 |
| 1tt 83 μm/83 μm | 1.00 |

The ratio of the width of the P/N-channel transistors of the output transistors of the driver circuit DR3 that is connected to the wiring 13 for the test clock 1tt is 1:1.

The operating of the test clock 1tt decreased, but from the viewpoint of crosstalk, it is preferable that the ratio of the width of the P/N-channel transistors of the output transistors of the driver circuit DR3 for the wiring 13 used for the test clock 1tt be 1:1 or in that vicinity.

Embodiment 2

Embodiment 2 of the first embodiment will be explained below.

Figure 13:
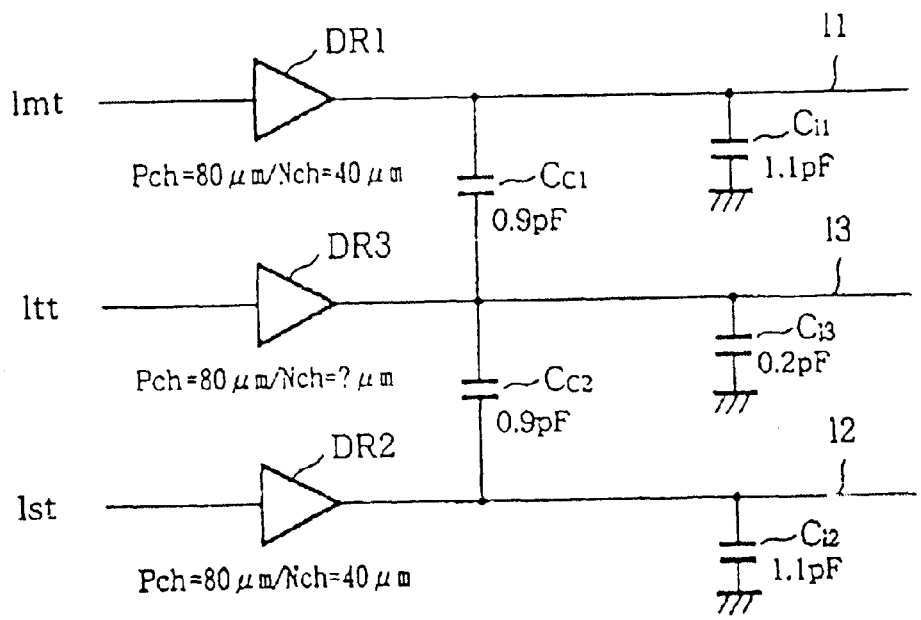
FIG. 13 is a circuit diagram used as an embodiment of the crosstalk prevention circuit illustrated in FIG. 11.

FIG. 13 is a schematic diagram used as an embodiment of the crosstalk prevention circuit illustrated in FIG. 10. This circuit example is used for the purpose of checking the limits of the driver circuits (buffer circuits) DR1 to DR3 and of the driver circuit DR3 in particular.

In FIG. 13, the circuit parameters are as follows.

(1) The electrostatic wiring capacitance of wires 11, 12, 13 as represented by $C_{11}$, $C_{12}$, $C_{13}$ is 1.1 pF, 1.1 pF, 0.2 pF, respectively.

(2) The electrostatic interwiring capacitance as represented by $C_{C1}$, $C_{C2}$ is 0.9 pF, 0.9 pF, respectively.

(3) The ratio of the width of the P/N-channel transistors (L is 0.6 μm) of the output transistors of the driver circuit DR1 is 80 μm/40 μm=2:1.

The ratio of the width of the P/N-channel transistors channel (L is 0.6 μm) of the output transistors of the driver circuit DR2 is 80 μm/40 μm=2:1.

The ratio of the width of the P/N-channel transistors (L is 0.6 μm) of the output transistors of the driver circuit DR3 is 80 μm/? (varies)

In the circuit of FIG. 13, the ratio of the width of the P/N-channel transistors (L is 0.6 μm) of the output transistors of the driver circuit DR3 varies, and the simulated results are presented below.

Figure 14:
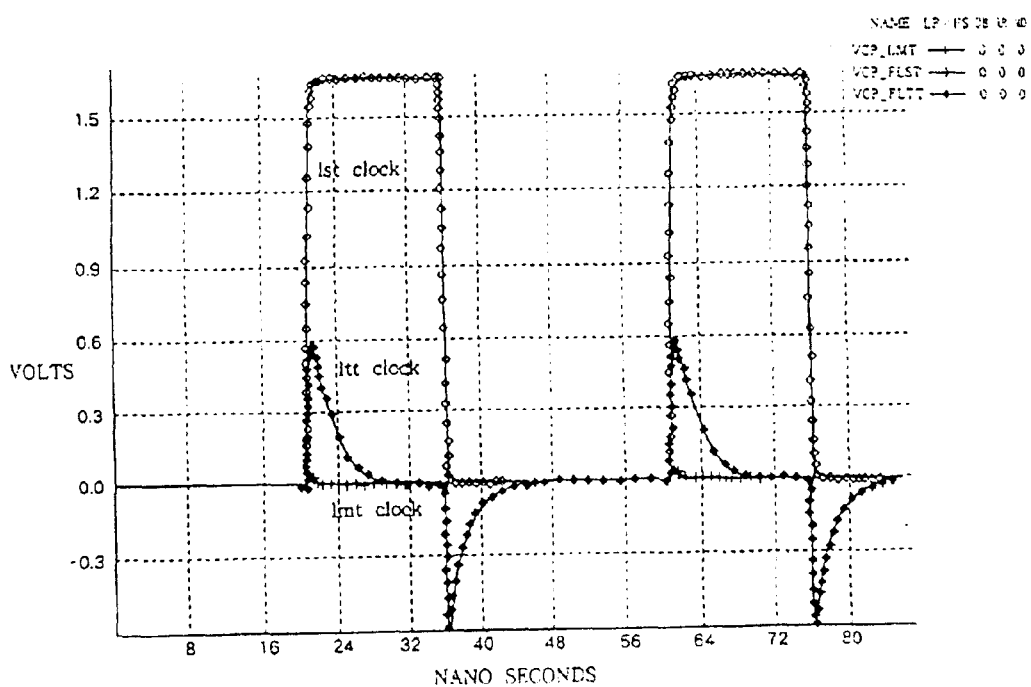
FIG. 14 is a signal waveform diagram when the P/N ratio of the output transistors of the driver circuit DR3 in FIG. 13 is 80 $\mu$m/2 $\mu$m=40:1, and only the slave clock 1st is applied to the wiring 12.

FIG. 14 is a signal waveform diagram when the ratio of the width of the P/N-channel transistors (L is 0.6 μm) of the output transistors of the driver circuit DR3 is 80 μm/2 μm=40:1, and only the slave clock 1st is coupled to the wiring 12.

Figure 15:
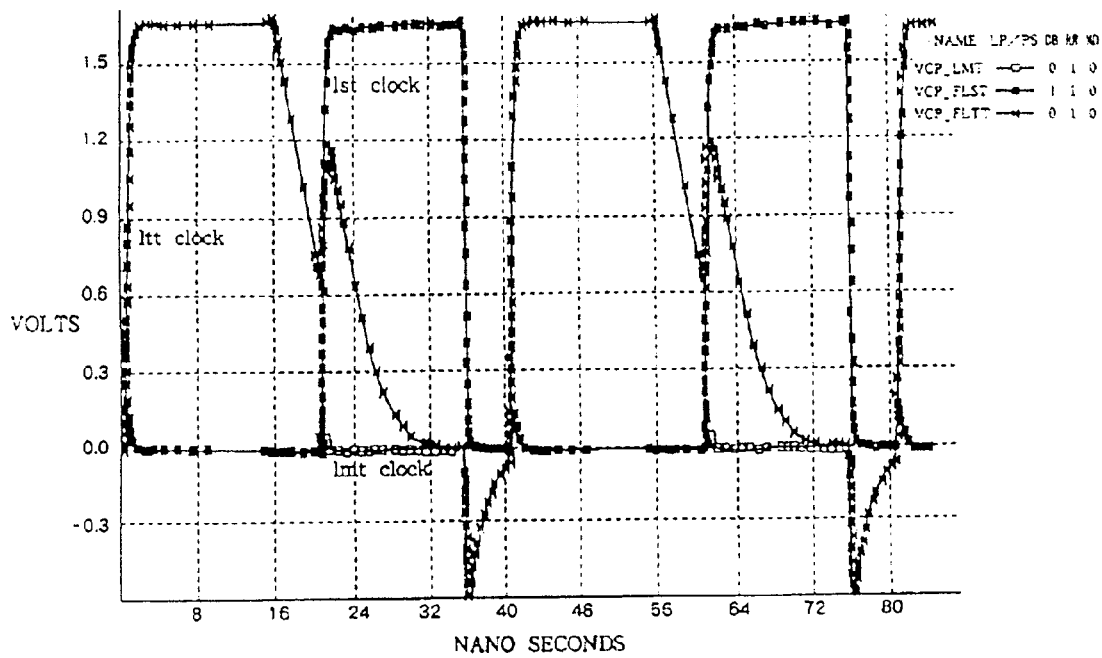
FIG. 15 is a signal waveform diagram when the P/N ratio of the output transistors of the driver circuit DR3 in FIG. 13 is 80 $\mu$m/2 $\mu$m=40:1, the master clock 1mt is applied to the wiring 11, and the slave clock 1st is applied to the wiring 12.

FIG. 15 is a signal waveform diagram when the ratio of the width of the P/N-channel transistors (L is 0.6 μm) of the output transistors of the driver circuit DR3 is 80 μm/2 μm=40:1, the master clock 1mt is coupled to wiring 11, and the slave clock 1st is coupled to the wiring 12.

Figure 16:
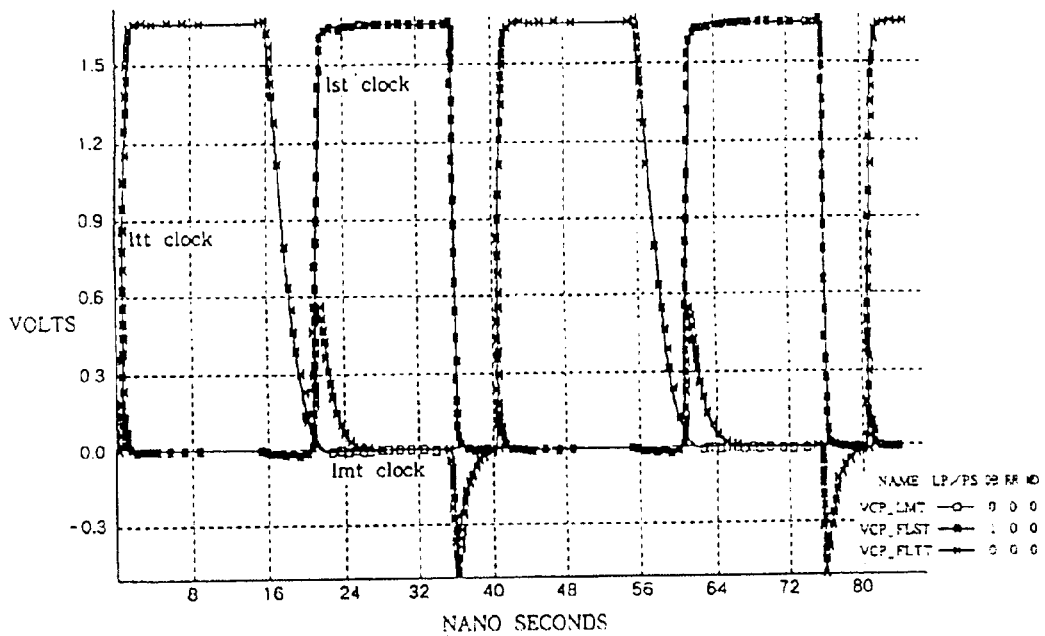
FIG. 16 is a signal waveform diagram when the P/N ratio of the output transistors of the driver circuit DR3 in FIG. 13 is 80 $\mu$m/4 $\mu$m=20:1, the slave clock 1st is applied to the wiring 12, and the test clock 1tt is applied to the wiring 13.

FIG. 16 is a signal waveform diagram when the ratio of the width of the P/N-channel transistors (L is 0.6 μm) of the output transistors of the driver circuit DR3 is 80 μm/4 μm=20:1, the slave clock 1st is coupled to the wiring 12, and the test clock 1tt is coupled to the wiring 13.

When the ratio of the width of the P/N-channel transistors of the output transistors of the driver circuit DR3 for the wiring 13 used for the test clock 1tt is high, the adjacent wires, for example, 11 and 13, 13 and 12, are subject to crosstalk.

Figure 17:
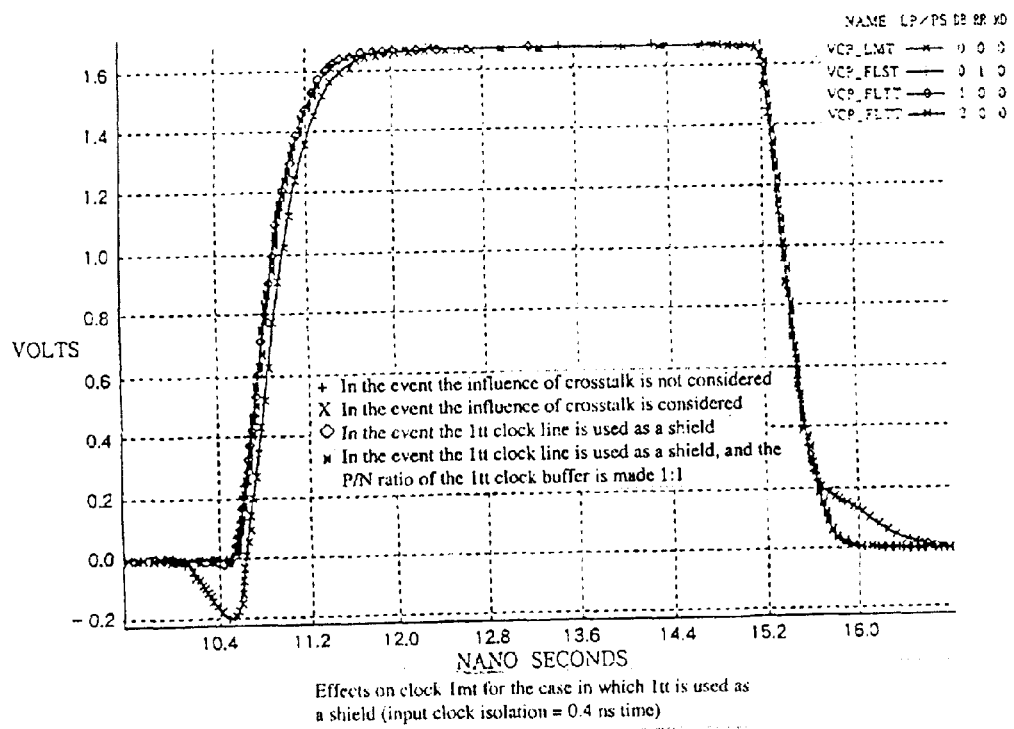
FIG. 17 is a graph showing the influence of the crosstalk on the master clock 1mt when the wiring 13 for the test clock 1tt in FIG. 13 is used as a shield.

FIG. 17 is a graph showing the influence of crosstalk on the master clock 1mt for the case in which the wiring 13 for the test clock 1tt in FIG. 13 is used as a shield. The isolation is 0.45 ns.

Figure 18:
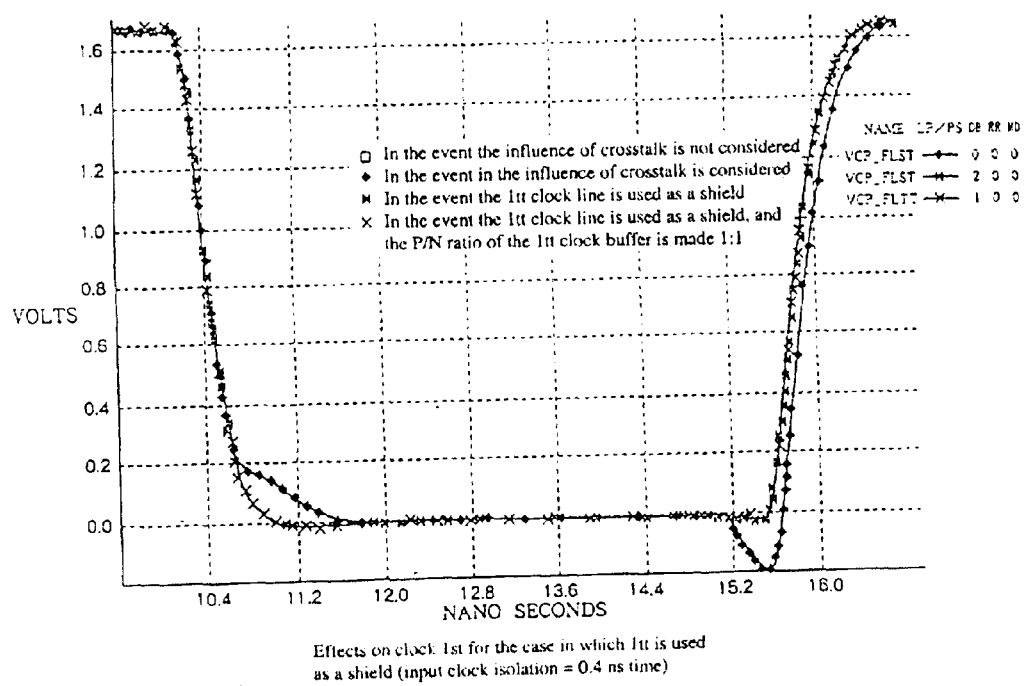
FIG. 18 is a graph showing the influence of the crosstalk on the slave clock 1st when the wiring 13 for the test clock 1tt in FIG. 13 is used as a shield.

FIG. 18 is a graph showing the influence of crosstalk on the slave clock 1st for the case in which the wiring 13 for the test clock 1tt in FIG. 13 is used as a shield. The isolation is 0.45 ns.

Figure 19:
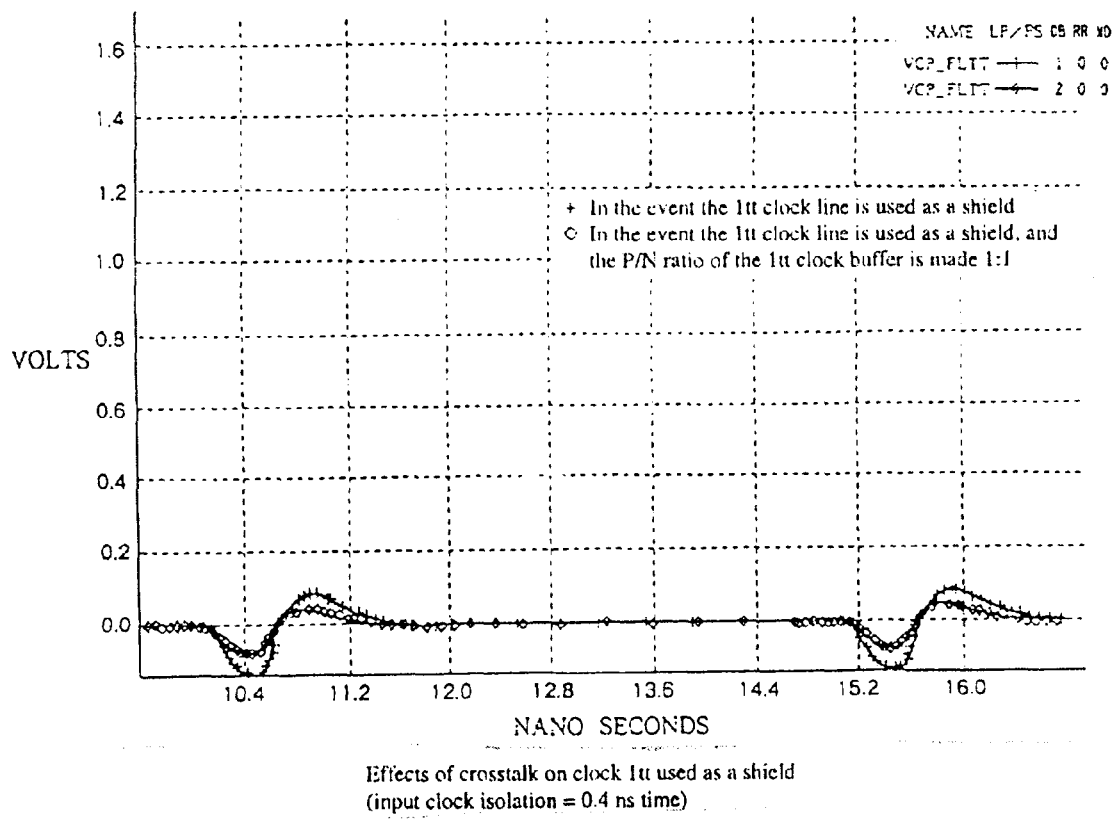
FIG. 19 is a graph showing the influence of crosstalk on the line 13 for the test clock 1tt in FIG. 13 that is used as a shield.

FIG. 19 is a graph showing the influence of crosstalk on the test clock 1tt in FIG. 13 that is used as a shield. The isolation is 0.45 ns.

An explanation is given in regard to a bus wiring circuit as the second embodiment of the present invention.

As the Embodiment 1, an explanation was given in regard to the wirings 11, 12, 13 for the master clock 1mt, the slave clock 1st, and the test clock 1tt, but the present invention can be effectively applied to other problems, for example, to crosstalk on bus lines in semiconductor devices.

In the event that the bus is bundled wiring, since the values change with the same timing, in the event that the transitions of the signals change in opposite directions in a bus line and the bus lines that run on both sides of that, the bus line that runs in the middle undergoes influence due to the crosstalk of the bus lines on both sides. These details are explained below.

Figure 20:
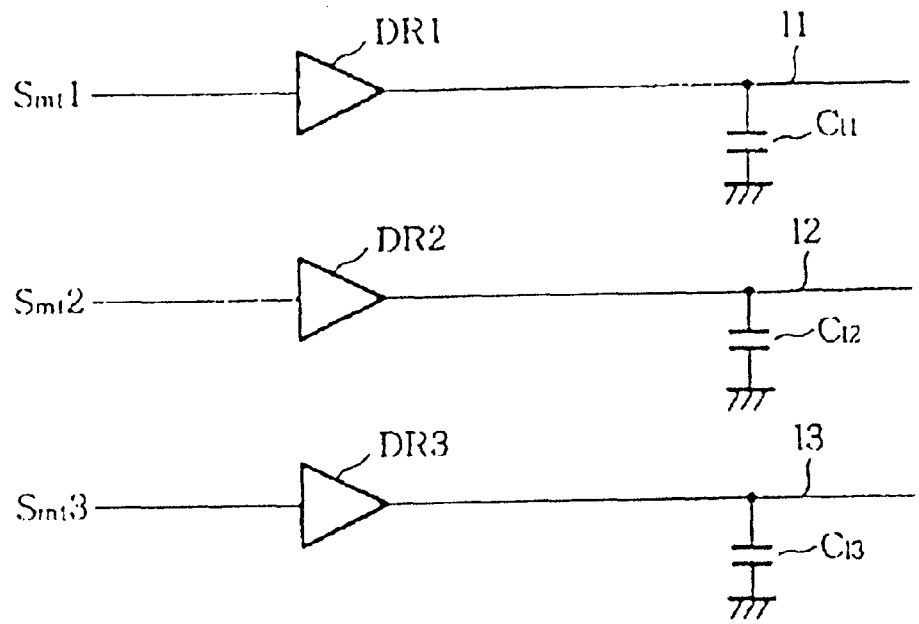
FIG. 20 is a bus wiring circuit for the Embodiment 2 when the crosstalk is not considered.
Figure 21:
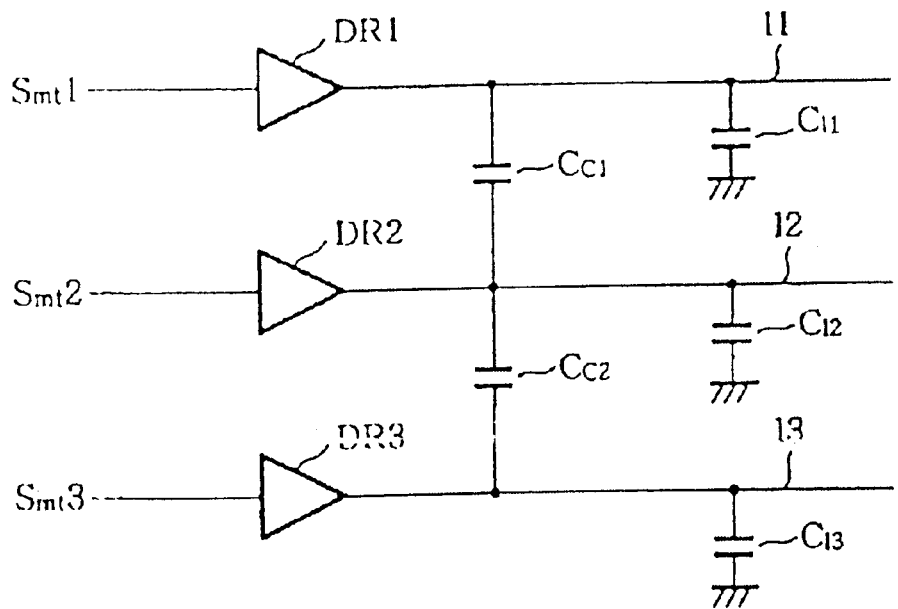
FIG. 21 is a bus wiring circuit for the Embodiment 2 when the crosstalk is considered.

FIG. 20 is a bus wiring circuit for the case in which crosstalk is not considered, and FIG. 21 is a bus wiring circuit for the case when crosstalk is considered.

Smt1 to Smt3 indicate buses in which the signal level changes with the master clock.

It is assumed that the signal level changes with the master clock; the bus has a capacity equivalent to a wire [with a length of] about 10,000 μm, and a simulation was conducted by means of SPICE in the same manner as in the clock simulation. The results are shown in Table II and FIG. 23.

TABLE II

Influence of crosstalk on bus line

|  | No influence of crosstalk | Influence of crosstalk | Differential |
| --- | --- | --- | --- |
| Rise time | 0.586 ns | 0.657 ns | 0.071 ns |
| Fall time | 0.436 ns | 0.822 ns | 0.386 ns |
| Gate delay time |  |  |  |
| From rise | 0.543 ns | 0.877 ns | 0.334 ns |
| From fall | 0.525 ns | 0.644 ns | 0.119 ns |

Figure 22:
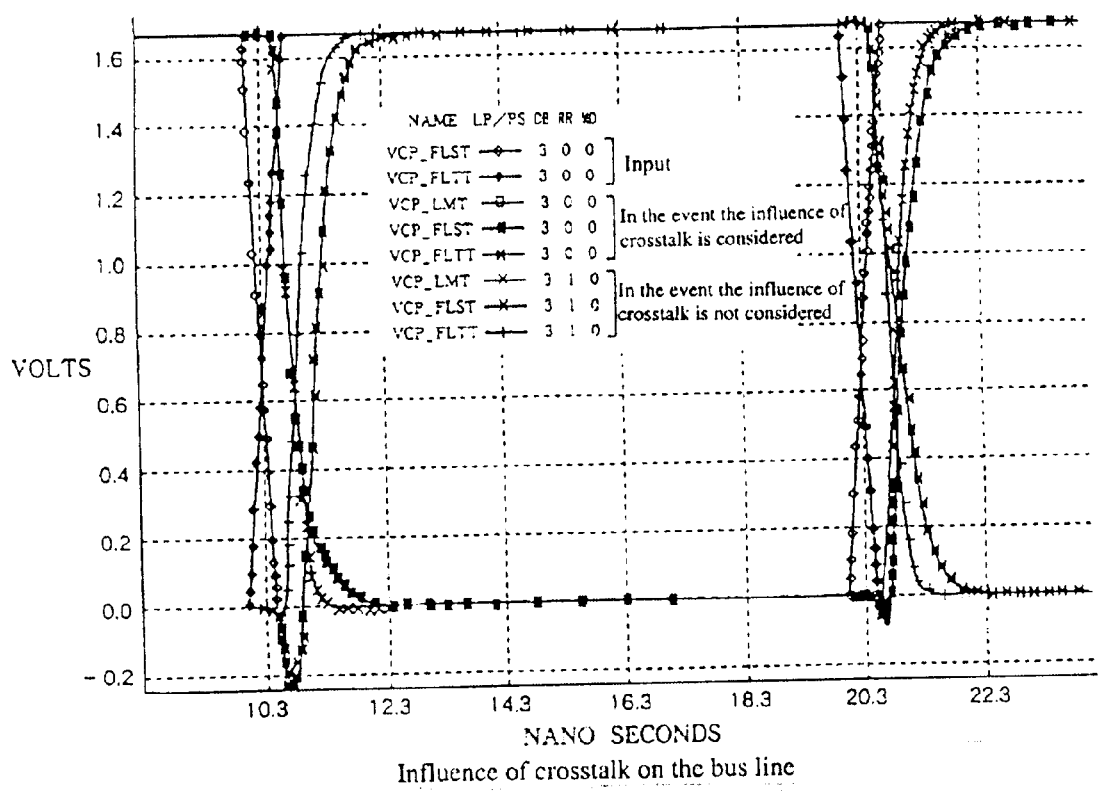
FIG. 22 is a graph showing the influence of crosstalk on the bus wiring.

FIG. 22 is a graph showing the influence of crosstalk on the bus line.

The output of the central master clock smt2 rises after it has fallen to about 0.2 V due to the influence of crosstalk. Thus, the gate delay time from the rise increases 0.3 ns or more. Also, the fall becomes gradual, and the rise time also increases about 0.4 ns.

Figure 23:
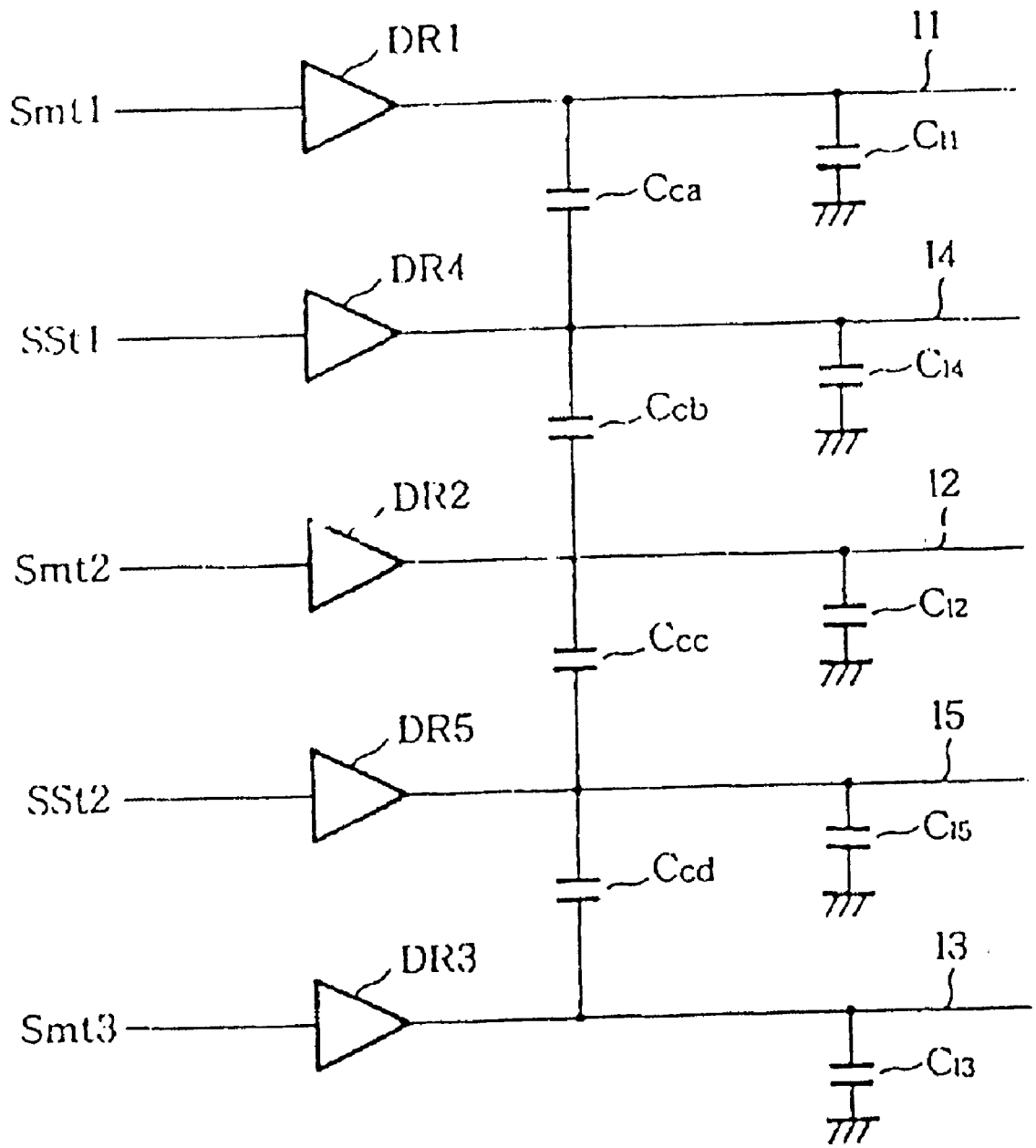
FIG. 23 is a circuit diagram of a bus wiring circuit used as the Embodiment 2 of the present invention.

Consider the circuit shown in FIG. 23. FIG. 23 is a circuit diagram of a bus wiring circuit used as Embodiment 2 of the present invention.

It is assumed that the level of the signals sst1, sst2 changes with the slave clock. The bus sst1 on which the signal level changes with the slave clock is inserted between the bus smt1 and the bus smt2 on which the signal level changes with the master clock, and the bus sst2 on which the signal level changes with the slave clock is inserted between the bus smt2 and the bus smt3 on which the signal level changes with the master clock. In other words, in the same manner as the Embodiment 1, the buses sst1, sst2 in which the value is changed with the slave clock are wiring used as shields, and prevent the influence of crosstalk. The results shown in Table III and FIG. 24 were thus obtained.

TABLE III

Improvement of the influence of crosstalk on the bus line

|  | No influence of crosstalk | Influence of crosstalk | Differential |
| --- | --- | --- | --- |
| Rise time | 0.586 ns | 0.540 ns | −0.046ns |
| Fall time | 0.436 ns | 0.461 ns | 0.025ns |

TABLE III-continued

Improvement of the influence of crosstalk on the bus line

|  | No influence of crosstalk | Influence of crosstalk | Differential |
| --- | --- | --- | --- |
| Gate delay time |  |  |  |
| From rise | 0.543 ns | 0.543 ns | 0.000ns |
| From fall | 0.525 ns | 0.521 ns | −0.004ns |

Figure 24:
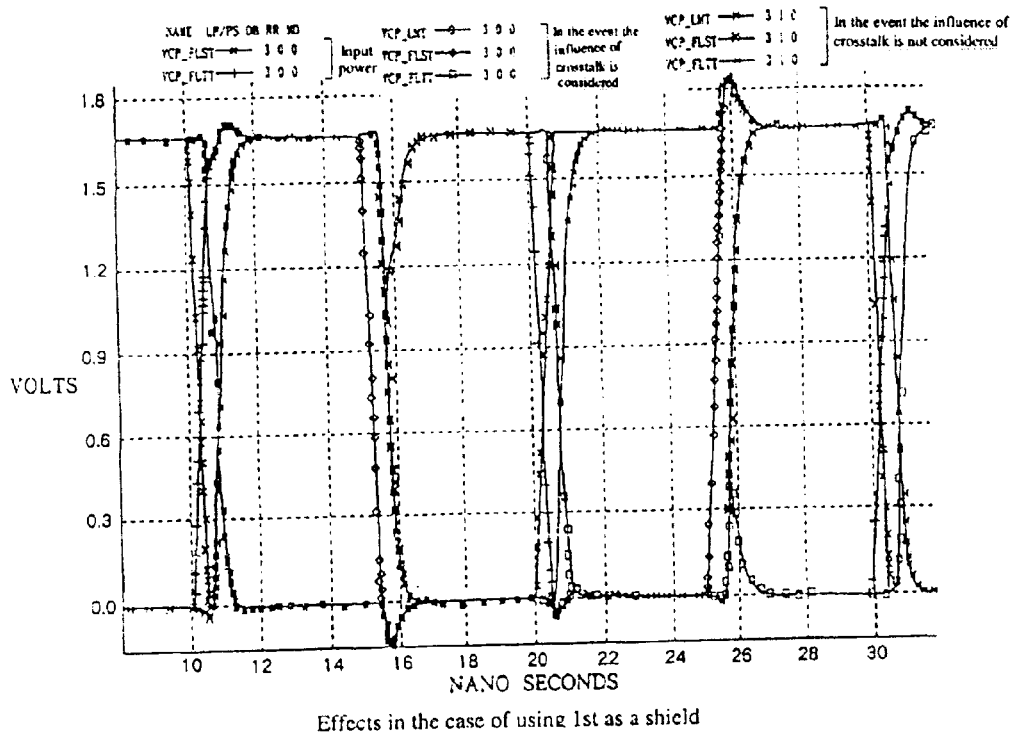
FIG. 24 is a graph showing the influence of crosstalk on the bus wiring.

FIG. 24 is a graph showing the influence of crosstalk on the bus line.

From the results of Table III and FIG. 24, it can be seen that there is a slight influence on the rise and fall times, but that there is no change for the case in which the gate delay time is not influenced by crosstalk. In other words, the crosstalk between the buses smt on which the signal level changes with the master clock and the buses sst on which the signal level changes with the slave clock does not influence the gate delay time, and the problem of crosstalk was sufficiently improved by using the buses sst as a shield.

Embodiment 3

An embodiment (Embodiment 3) of the Embodiment 2 will be explained below.

Figure 25:
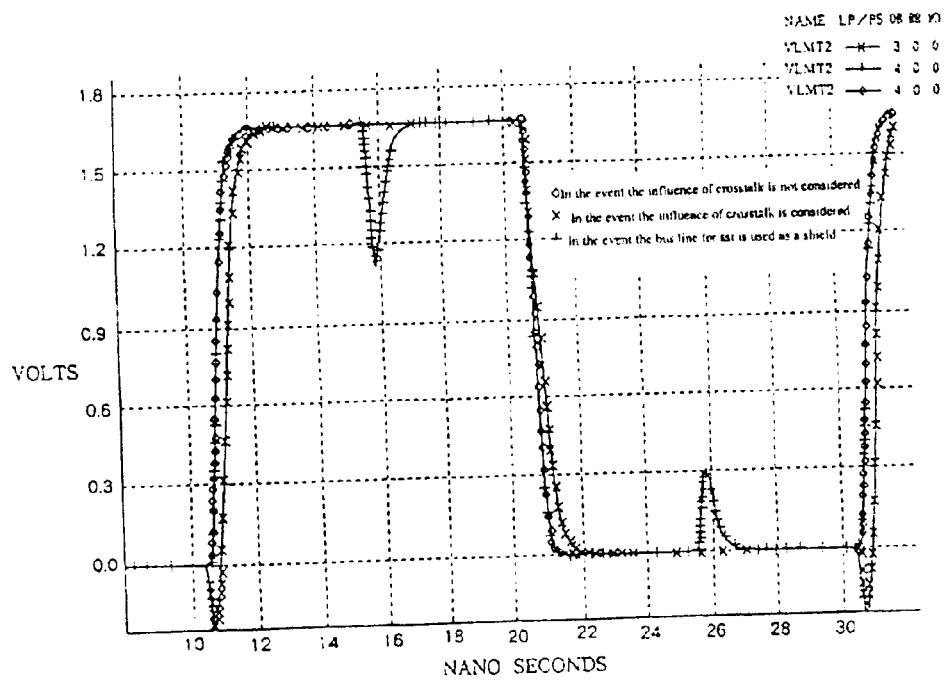
FIG. 25 is a graph showing the influence on the bus smt2 in which the value is changed according to the value of the master clock in the case when the bus in which the value changes according to the changes of the slave clock is used as a shield.

FIG. 25 is a graph showing the influence on the bus smt2 on which the signal level changes with changes of the master clock for the case in which a bus on which the signal level changes with changes of the slave clock is used as a shield.

Figure 26:
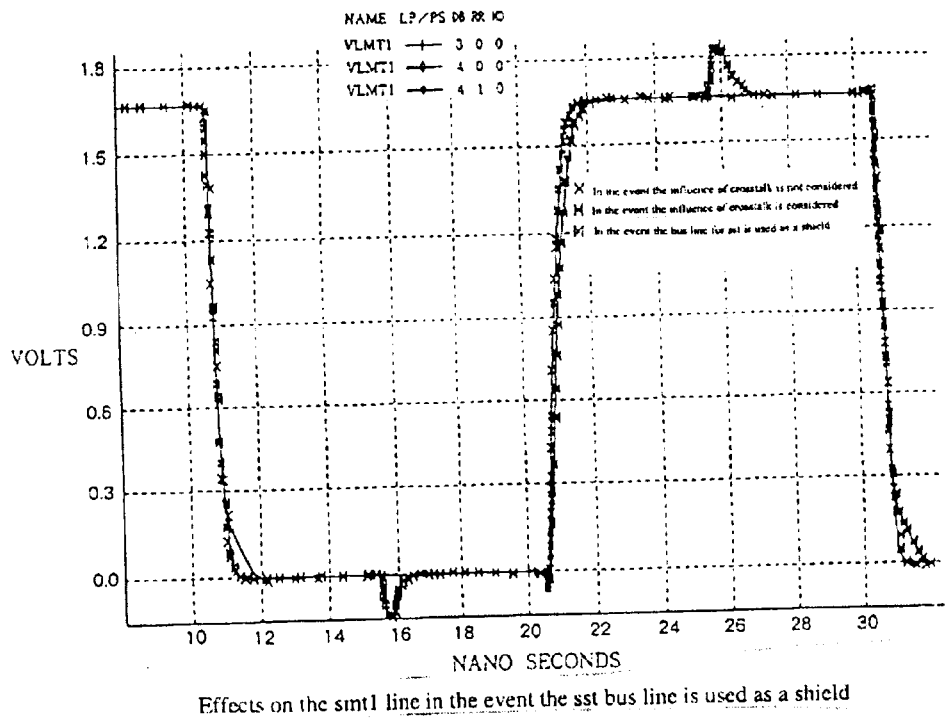
FIG. 26 is a graph showing the influence on the bus smt1 in which the value is changed according to the value of the master clock in the case when the bus in which the value changes according to the changes of the slave clock is used as a shield.

FIG. 26 is a graph showing the influence on the bus smt1 on which the signal level changes with changes of the master clock for the case in which a bus on which the signal level changes with changes of the slave clock is used as a shield.

Figure 27:
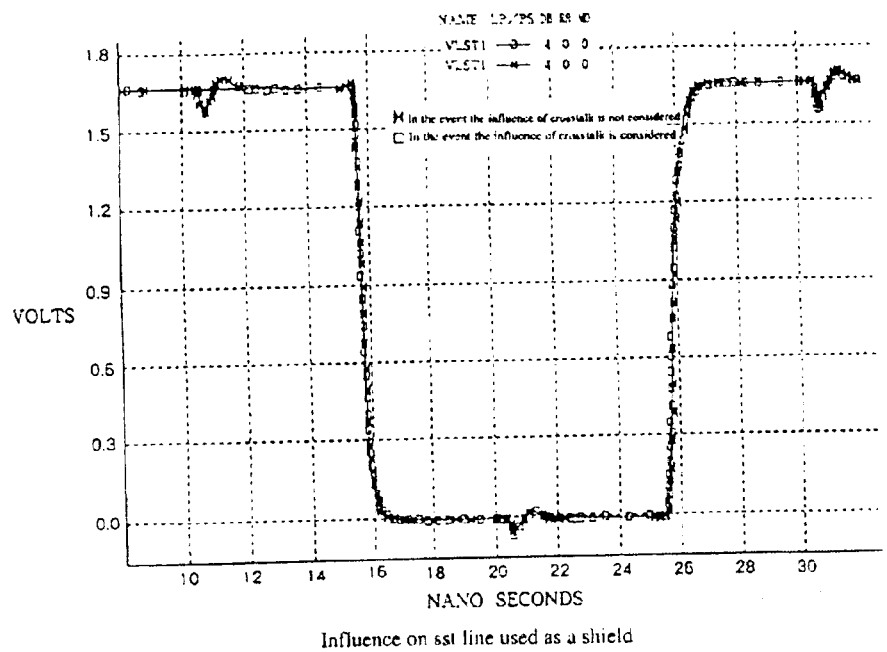
FIG. 27 is a graph showing the influence on the bus, in which the value changes according to the slave clock, and which is used as a shield.

FIG. 27 is a graph showing the influence on a bus on which the signal level changes with changes of the slave clock used as a shield.

These results also, show that the crosstalk between the bus smt on which the signal level changes with the master clock and the bus sst on which the signal level changes with the slave clock does not influence the gate delay time, and the problem of crosstalk is sufficiently improved by using the bus sst as a shield.

Consideration of Surface Area

Table IV is a table showing the fact that there is no increase in surface area for the above-mentioned Embodiment 1 and the Embodiment 2.

TABLE IV

Comparison of layout surface area of the present invention and another improved method

| | Increase of surface area due to crosstalk improvement | | |
| --- | --- | --- | --- |
|  | The present invention | Widening space | Wiring additions |
| Clock | +0 μm | +16.2 μm | +1.2 μm |
| Bus (16 bit) | +0 μm | +243 μm | +21 μm |

On the other hand, as in the past, crosstalk countermeasures include (1) the method that increases the spacing, and (2) the method that provides another means of shielding.

In the case of reducing crosstalk by increasing the spacing between the wiring, since the surface area will be increases by as much as 243 μm for a 16-bit bus, this method is not used at the present time.

As was explained above, the addition of wiring for shielding purposes can be extremely effective, but the additional wiring increases the surface area.

The present invention has the advantage that crosstalk can be reduced without increasing the surface area. In other words, another advantage of the present invention is that the surface area is not increased.

For the crosstalk prevention circuit of the present invention, the clock supply circuit of the Embodiment 1, and the bus wiring circuit of the Embodiment 2, were illustrated, but the present invention is not limited to the above-mentioned embodiments; it can also be applied in other forms in the same manner as mentioned above.

Another crosstalk prevention circuit is explained below.

Embodiment 3 of the crosstalk prevention circuit of the present invention will be explained below.

As mentioned above, the delay in the signal lines originating in crosstalk in the wiring portions due to miniaturization of LSI device of recent years has become a problem. In order to solve this problem, various designs have been proposed for changing the operating timing and phase of the signals on adjacent wires, and it can be seen that the propagation delay of signals on data buses due to crosstalk on such devices as DSPs, including the gate delay due to glitches, has increased by as much as 46%. This is summarized in FIG. 3.

For example, if the signal that changes at the master phase is liberated, when a given signal changes from high to low, in the event that the signal lines on both sides change from low to high, the delay due to the coupling that accompanies the increase of the ratio of the interwiring capacitance due to the reduction of the spacing between wires in the miniaturization of VLSI devices in recent years has become a great problem. In FIG. 4 an equation and a model are shown for finding the value of the coupling voltage linked to the increase in delay time.

In the past, during the time that metal wires with a grain size below (about 1 $\mu$m) for photolithography were used, the addition of a shield line for the purpose of preventing crosstalk was simply considered overhead that increased the surface area.

However, in the most recent semiconductor device manufacturing processes for the 0.35 $\mu$m class using a wiring width of less than 0.5 $\mu$m, the peak current density for metal has doubled.

If this property is exploited, the problem increased delay time due to crosstalk and poor functioning can be completely eliminated while suppressing an increase in the surface area.

The Embodiment 3 of the present invention is based on this knowledge. In other words, the Embodiment 3 relates to wiring technology in which new design methods in which the guidelines for solving electromigration (EM) problems in miniaturized VLSI devices of recent years have been included for the purpose of solving the crosstalk problem.

Figure 28:
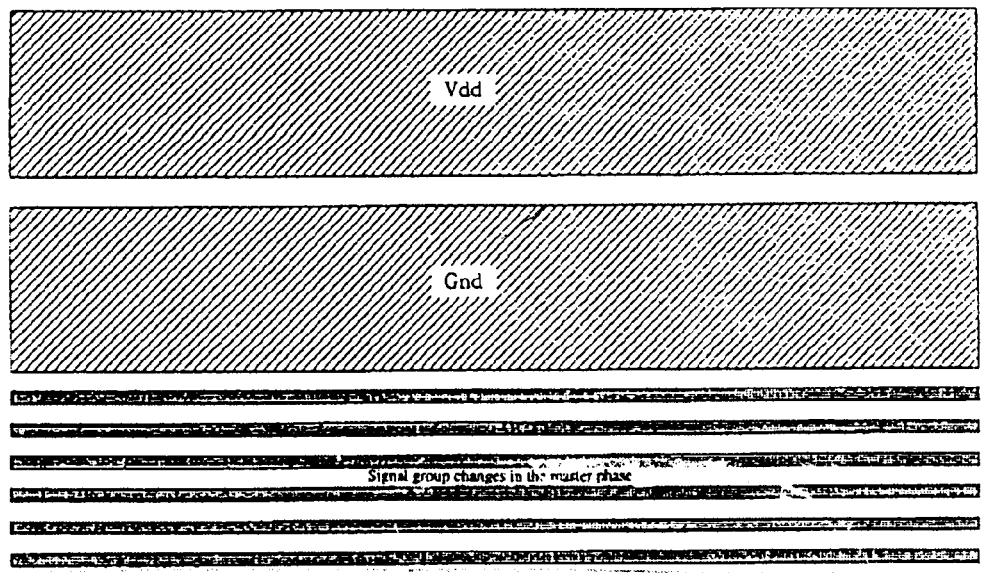
FIG. 28 is a conventional wiring diagram.

In the past, as shown in FIG. 28, conductors for the power supply, ground, and signal lines have their various widths. These widths were determined by analyzing the average current, the peak current, and the RMS current consumed for the connected module, and the voltage drop for the resistive portions. However, in practice, in most cases the wiring width was determined by the peak current. In the case of metal wiring with a width of less than 0.5 $\mu$m, because the grain size (grain boundary) of the metal is 1 $\mu$m, the resistance to electromigration increases by leaps and bounds. As a result, a peak current of up to double that of the past is permitted.

Therefore, the surface for the layout on wiring with a width less than 0.5 $\mu$m that is used for the power supply, ground and signal lines, etc., is excellent.

As previously mentioned, because the width of the metal wiring in most cases is determined by the peak current, in the Embodiment 3, a wiring method is proposed that enables the complete elimination of crosstalk by means of shielding without increasing the surface area and without worrying about the effects of the wiring on operations, etc.

In designs that takes the effects of the wiring on operation into account, the identification and accurate assessment of these effects are difficult; and because the design is made on a worst-case basis increase in the area is caused by excessive product quality, and the time needed for design and verification is also significantly increased. If this embodiment of the present invention is used, these problems can all be solved because the influence of crosstalk has been eliminated; it is aimed at an improved design that is also able to realize the best electronic operating conditions.

Figure 29:
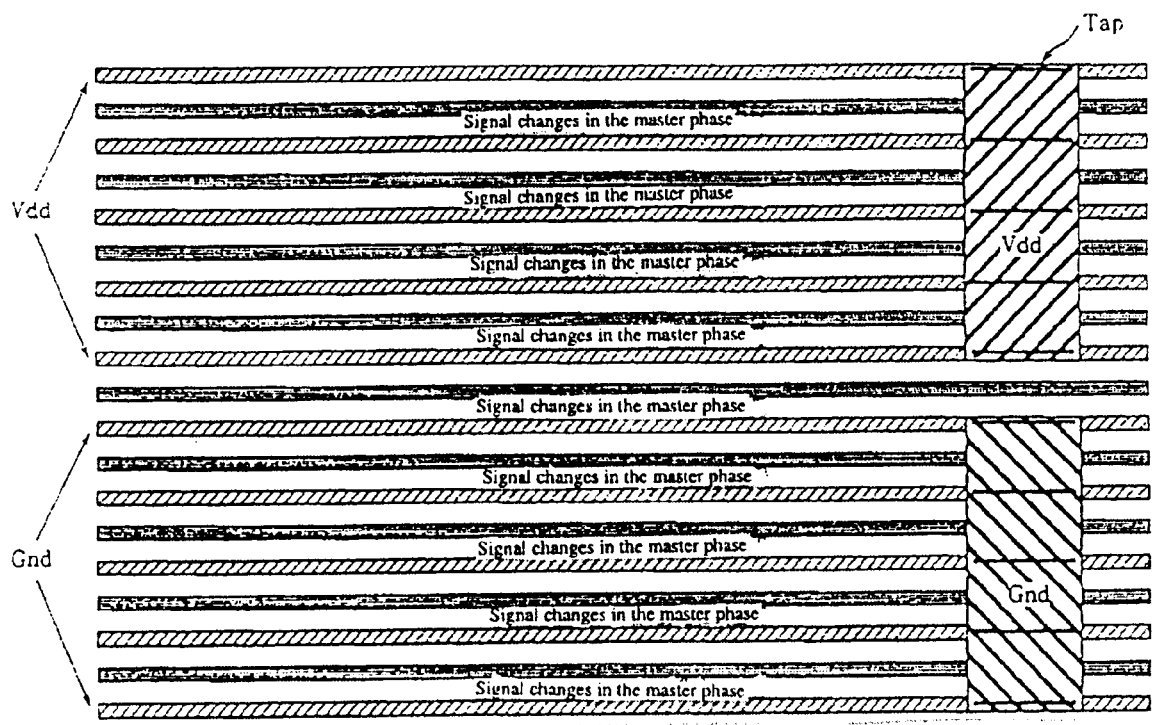
In FIG. 29, a signal wiring diagram is shown for the purpose of crosstalk prevention in which the electromigration is considered, as the Embodiment 3.

In FIG. 29, as the Embodiment 3, a signal wiring diagram is shown for the purpose of crosstalk prevention in which electromigration is considered.

In FIG. 29, if the width of the metal wiring is 0.5 $\mu$m or less, because the resistance to electromigration is doubled, and because the wiring for the power supply Vdd and the wiring width for the ground Gnd can be made ½ compared to the example illustrated in FIG. 28, in processes in which the width is 0.5 $\mu$m and the spacing is 0.5 $\mu$m, since it is canceled out by the spacing, there is no surface area increase.

However, since the influence in relation to the WR (Width Reduction Factor), as shown in FIG. 29, increases due to the division of the wiring, for example, since in a 0.35 $\mu$m process it is 0.035 $\mu$m/side, when the present invention is applied to 16 buses, in the worst-case analysis it becomes 16×(0.035×2)=1.125 $\mu$m, and is made 0.5 $\mu$m wiring, it is necessary to increase about two line portions. However, if it is made a wiring with 0.5 $\mu$m shielding and the power supply ground is made 0.5 $\mu$m on both sides of the 16 buses, it becomes 17 lines, and when combined with the two lines used for the WR reinforcement, since that only becomes a total width of 19×0.5 $\mu$m=9.5 $\mu$m, because from practical usage these widths require a thicker device, the increased portion for two lines in most cases does not constitute an increase.

The hindrance to making this type of wiring by using a routing tool is low, electrical properties are utilized wherein the resistance to electromigration is doubled due to the fact that the power source, ground, and other wiring are formed at a width that is less than the grain size for electromigration, the surface area does not increase, and a design becomes possible in which there is no influence of crosstalk, verification due to the conventional high-speed static timing simulation, or excessive quality design due to an assumption of the worst-case.

An explanation is given in regard to an Embodiment 4 of the present invention.

Figure 30:
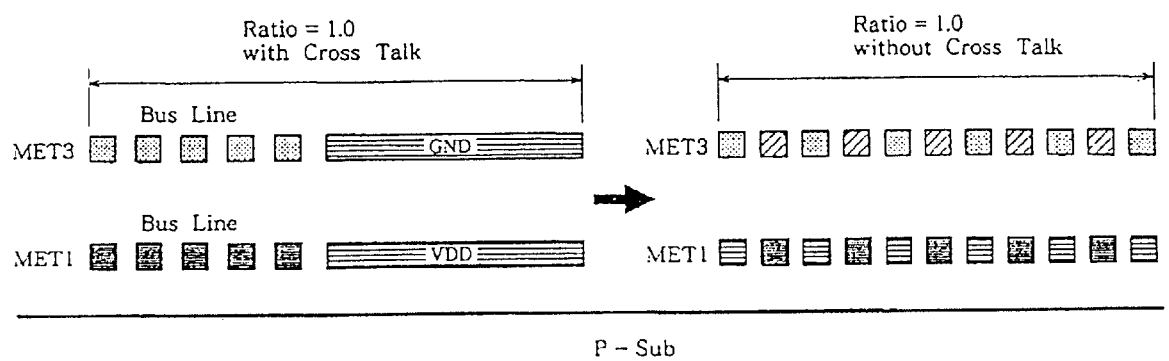
FIG. 30 is an illustration of the Embodiment 4.

FIG. 30 illustrates the Embodiment 4.

FIG. 30 shows an embodiment of the third [sic] configuration, and in FIG. 29 an example is shown in which the power supply and ground lines have widths of 0.5 $\mu$m and are arranged dispersed, by considering the electromigration in the planar direction, but FIG. 30 shows an example wherein, in regard to the metal wiring for the first layer and the metal wiring for the third layer, along with making the metal wiring of the same layers a wiring as is illustrated in FIG. 29 so that the crosstalk is reduced, it is arranged so that the crosstalk is also reduced in the height direction.

In other words, the Embodiment 4 shows an example that executes the wiring considering the electromigration three-dimensionally.

An explanation was given in regard to two configurations as crosstalk prevention circuits of the present invention, but the present invention is not limited to the above-mentioned configurations, and it can also be applied to other fields in the same manner as mentioned above.

According to the first viewpoint of the present invention, the influence of crosstalk can be reduced without increasing the surface area.

Also, since the present invention does not require special high-speed technology, it can be easily reduced to practice.

According to the second viewpoint of the present invention, the problems of delay due to crosstalk and poor functions can be completely removed while suppressing surface area increases by using the physical properties of electromigration.

What is claimed is:

1. A crosstalk prevention circuit for reducing crosstalk between at least two approximately parallel signal lines comprising a third signal line located in between said two parallel signal lines, a signal being applied to said third signal line when a signal that is to be applied to at least one of said two parallel signal lines is not present, and said third signal line being grounded when a signal is applied to both of said two parallel signal lines.

2. The crosstalk prevention circuit of claim 1, wherein the third signal line is connected to a driver circuit, and the ratio of the current drive capabilities of the N-channel transistor and the P-channel transistor of the output transistors of said driver circuit is about 2:1.

3. The crosstalk prevention circuit of claim 1 wherein a first clock and a second clock with prescribed phase difference relative to said first clock are applied to the first and second signal lines, and a signal that is applied during test operations is applied to the third signal line.

4. The crosstalk prevention circuit of claim 1 wherein the first and second signal lines are signal lines whose voltage changes as a function of the first signal, and the third signal line is a signal line whose voltage changes as a function of the phase difference of a signal that is different than the first signal.

5. The crosstalk prevention circuit of claim 2 wherein a first clock and a second clock with prescribed phase difference relative to said first clock are applied to the first and second signal lines, and a signal that is applied during test operations is applied to the third signal line.

6. The crosstalk prevention circuit of claim 2 wherein the first and second signal lines are signal lines whose voltage changes as a function of the first signal, and the third signal line is a signal line whose voltage changes as a function of the phase difference of a signal that is different than the first signal.

* * * * *